(12) United States Patent
Torres et al.

(10) Patent No.: US 6,949,444 B2
(45) Date of Patent: Sep. 27, 2005

(54) HIGH-FREQUENCY LINE

(75) Inventors: Joaquim Torres, Saint Martin le Vinoux (FR); Vincent Arnal, Crenoble (FR); Alexis Farcy, La Ravoire (FR)

(73) Assignee: STMicroelectronics S.A., Montrouge (FR)

( * ) Notice: Subject to any disclaimer, the term of this patent is extended or adjusted under 35 U.S.C. 154(b) by 330 days.

(21) Appl. No.: 10/117,782

(22) Filed: Apr. 5, 2002

(65) Prior Publication Data

US 2002/0164867 A1 Nov. 7, 2002

(30) Foreign Application Priority Data

Apr. 6, 2001 (FR) .......................................... 01 04693

(51) Int. Cl.[7] .............................................. H01L 21/76
(52) U.S. Cl. ..................... 438/405; 438/411; 438/421; 438/422; 438/424; 438/427; 438/619; 438/620
(58) Field of Search ................................ 438/404, 405, 438/411, 421, 422, 424, 427, 430, 431, 432, 619–620

(56) References Cited

U.S. PATENT DOCUMENTS

| | | | | |
|---|---|---|---|---|
| 4,859,622 A | * | 8/1989 | Eguchi ......................... | 437/47 |
| 4,888,300 A | * | 12/1989 | Burton ......................... | 437/61 |
| 5,098,856 A | * | 3/1992 | Beyer et al. .................. | 437/65 |
| 5,204,280 A | * | 4/1993 | Dhong et al. ................. | 437/52 |
| 5,466,630 A | * | 11/1995 | Lur ............................. | 438/407 |
| 5,516,720 A | * | 5/1996 | Lur et al. ..................... | 438/422 |
| 5,595,926 A | * | 1/1997 | Tseng ........................... | 437/52 |
| 6,057,202 A | * | 5/2000 | Chen et al. ................... | 438/421 |
| 6,071,805 A | * | 6/2000 | Liu .............................. | 438/619 |
| 6,307,247 B1 | | 10/2001 | Davies | |
| 6,342,427 B1 | * | 1/2002 | Choi et al. ................... | 438/422 |
| 6,383,889 B2 | * | 5/2002 | Yoshida ....................... | 438/411 |
| 6,406,975 B1 | * | 6/2002 | Lim et al. .................... | 438/421 |
| 6,498,069 B1 | * | 12/2002 | Grivna ......................... | 438/422 |
| 6,617,252 B2 | * | 9/2003 | Davies ......................... | 438/698 |

FOREIGN PATENT DOCUMENTS

DE 198 47 440 A 6/1999

OTHER PUBLICATIONS

French Search Report from French Patent Application 01/04693, filed Apr. 6, 2001.
Patent Abstracts of Japan, vol. 1999, No. 03, Mar. 31, 1999 & JP 10 321802 A (Toshiba Corp.).
Patent Abstracts of Japan, vol. 2000, No. 20, Jul. 10, 2001 & JP 2001 077315 A (Toshiba Corp.).
Patent Abstracts of Japan, vol. 018, No. 326 (E–1565), Jun. 21, 1994 & JP 06 077709 A (Nissan Motor Co. Ltd.).

* cited by examiner

*Primary Examiner*—Lynne Gurley
(74) *Attorney, Agent, or Firm*—Lisa K. Jorgenson; James H. Morris; Wolf, Greenfield & Sacks, P.C.

(57) ABSTRACT

A method for forming at least one conductive line intended to receive high-frequency or high-value currents, formed above a given portion of a solid substrate outside of which are formed other elements, including the steps of digging at least one trench in the solid substrate; forming an insulating area in the trench; and forming said conductive line above the insulating area.

10 Claims, 4 Drawing Sheets

HIGH-FREQUENCY LINE

BACKGROUND OF THE INVENTION

1. Field of the Invention

The present invention generally relates to the forming, in an integrated circuit chip in and/or on which are formed other active and/or passive components as well as corresponding connection lines of devices disturbing in terms of inductive and/or capacitive parasitic couplings. More specifically, the present invention relates to the forming of conductive lines intended to receive high-frequency and/or high currents, such as an inductive winding (inductance) intended to be used as an antenna for mobile phone, or a metal line intended to be used as an electrode for a capacitor of metal/insulator/metal type (MIM).

2. Discussion of the Related Art

Conventionally, an insulating area between such a conductive line and the underlying conductive levels, such as a semiconductor substrate, is provided to avoid or at least reduce possible capacitive and/or inductive couplings due to the flowing in the line of a high-frequency and/or high current.

FIGS. 1A to 1C illustrate, in a simplified partial cross-section view, conventional steps of forming of said lines on an integrated circuit chip. For clarity and as a non-limiting example, the forming of a single line, forming an inductive winding or inductance, will be considered.

FIG. 1A illustrates the state of an integrated circuit after initial steps preceding the forming of an inductance. At this stage of the process, a solid semiconductor substrate 10, typically made of silicon, in and on which are formed various elements, is covered with successive conductive layers, each layer including conductive portions separated by insulating portions. Only the last two layers, Mn–1 and Mn, formed before the inductance forming are detailed in FIG. 1. The various other layers between substrate 10 and layer Mn–1 are generally designated with reference 11. Layer Mn–1 includes metal portions 12, 13, separated by insulating portions 14. Similarly, upper layer Mn includes metal portions 15 separated by insulating portions 16.

At the next step, illustrated in FIG. 1B, an insulating layer 17 is deposited so that its upper surface is substantially planar. Insulating layer 17 is particularly thick as compared to insulators 14, 16 of underlying layers Mn–1, Mn. Thus, while insulators 14, 16 typically have a thickness on the order of from 0.5 to 1.5 $\mu$m, insulating layer 17 exhibits a thickness ranging between 5 and 20 $\mu$m.

At the next steps, an insulating layer 18 is deposited so that its upper surface is planar. Insulating layer 18 is opened according to the inductance pattern and a metal layer 19, generally made of copper, is deposited. Layer 19 is then etched to only be maintained in place in the pattern previously opened in layer 18. It is ascertained that only insulating portions are present in each of layers Mn, Mn–1 and of underlying layers 11 above inductance 19. Thick layer 17 has the object of insulating the lower levels (underlying substrate 10) from any inductive or capacitive parasitic coupling with inductance 19.

A disadvantage of the previously-described method results from the need to provide a thick insulating layer above the usual layers intended for the integrated circuit interconnections, the metal intended for the inductance forming being arranged above this thick insulating layer.

SUMMARY OF THE INVENTION

The present invention aims at a method for forming an integrated conductive line in an integrated circuit chip, which overcomes the disadvantages of prior art.

To achieve these and other objects, the present invention provides a method for forming at least one conductive line intended to receive high-frequency or high value currents, formed above a given portion of a solid substrate outside of which are formed other elements, including the steps of:

a) digging at least one trench into the solid substrate;

b) forming an insulating area in the trench; and c) forming said conductive line above the insulating area.

According to an embodiment of the present invention, several trenches are dug into the solid substrate during step a); step b) including depositing an insulating material in the trenches.

According to an embodiment of the present invention, the deposition of the insulating material is performed to close the trenches without filling them, maintaining an air bubble in each of the trenches.

According to an embodiment of the present invention, the deposition of the insulating material is preceded by an anneal adapted to causing the full oxidation of pillars separating two trenches.

According to an embodiment of the present invention, the method includes the steps of:

digging a single trench in the solid substrate;

depositing an insulating material in the trench, so that its upper surface is substantially coplanar with the upper surface of the peripheral solid substrate;

forming in and on the substrate, except above the trench filled with the material, at least a portion of the other elements;

digging chimneys to partially expose the upper surface of the material;

causing the removal of the material, whereby a cavity is formed in the solid substrate; and closing the chimneys by depositing an insulating material to maintain the cavity intact.

According to an embodiment of the present invention, the material is a polymer of the polycaprolactone family or of the polyimide family.

According to an embodiment of the present invention, said at least one conductive line is formed at step c) simultaneously with metal interconnects of some of the other devices.

The present invention also provides a line intended to receive a high-frequency or high current, formed in a same integrated circuit chip as other elements, and formed in at least one conductive layer, above an insulating layer formed inside of a solid substrate and of an electric permittivity smaller than any other insulating layer also formed inside of said substrate.

According to an embodiment of the present invention, the insulating area above which the line is formed includes gaps.

According to an embodiment of the present invention, the insulating area above which the line is formed is a cavity.

The foregoing objects, features and advantages of the present invention, will be discussed in detail in the following non-limiting description of specific embodiments in connection with the accompanying drawings.

DETAILED DESCRIPTION

For simplification, the same elements have been designated with the same references in the different drawings. Further, as usual in the representation of integrated circuits, the various drawings are not to scale.

The present invention provides forming an insulating area in the solid semiconductor substrate in and on which will be formed various elements such as active and/or passive components and the connection lines thereof. Conductive lines intended to receive high-frequency and/or high currents are formed above this insulating area, in a conductive layer, as will be detailed hereafter. For clarity, and as a non-limiting example, the present invention will be described as applied to the forming of a single high-frequency conductive line forming an inductance.

Figure 1A:
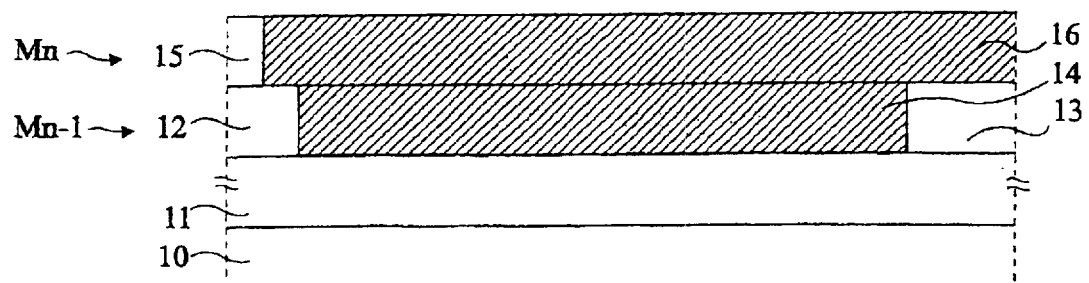
FIGS. 1A to 1C illustrate, in partial simplified cross-section views, a conventional high-frequency line forming method.
Figure 1B:
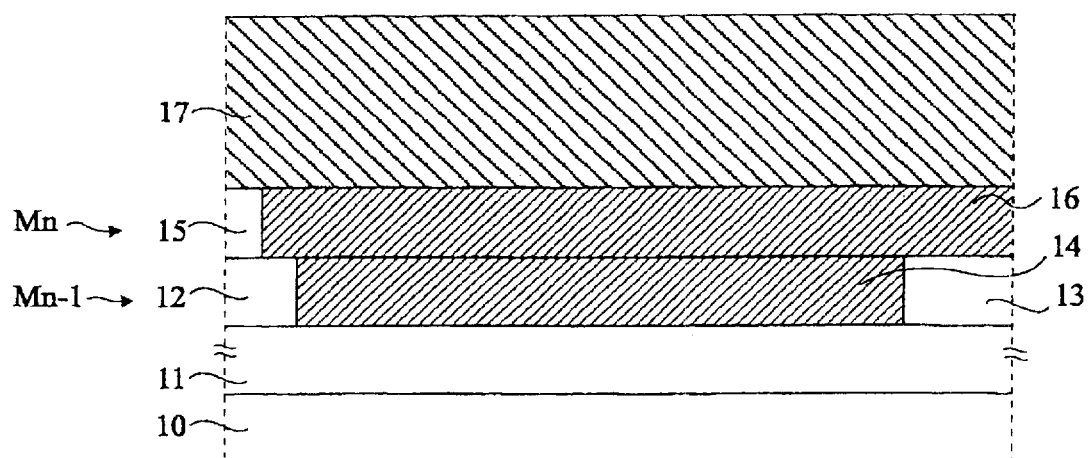
Figure 1C:
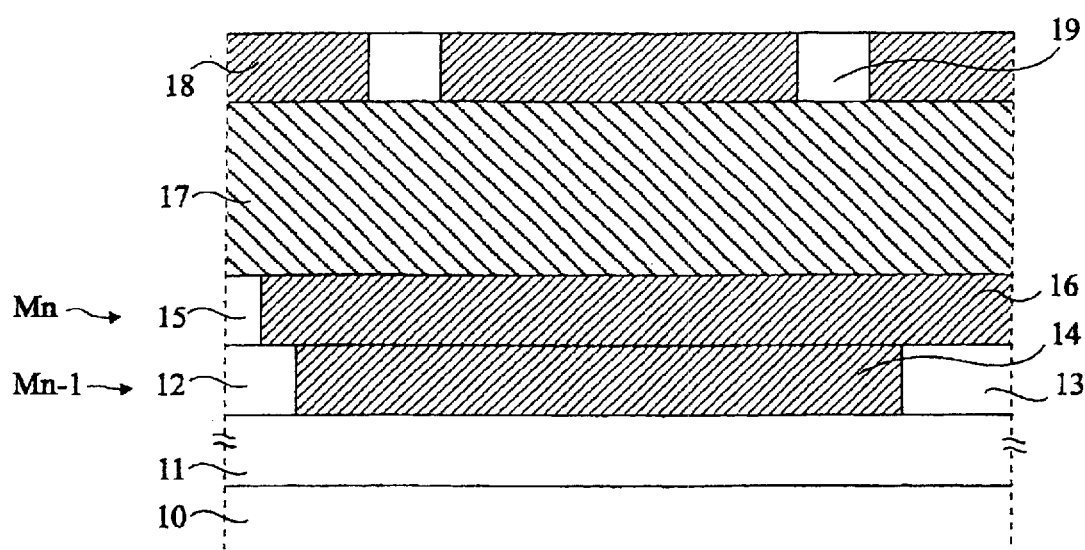
Figure 2A:
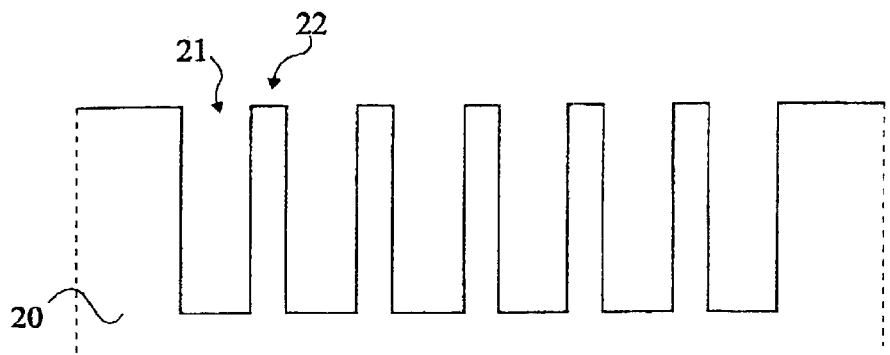
FIGS. 2A to 2E illustrate, in partial simplified cross-section views, a mode of forming an inductive and capacitive insulating area according to the present invention applied to the forming of a high-frequency inductance.

As illustrated in FIG. 2A, the forming of an inductance (line) according to the present invention starts with the digging in a solid semiconductor substrate 20, for example, made of silicon, of parallel trenches 21 as close as possible to one another. The portions or "pillars" 22 of substrate 20 left in place between two trenches 21 have as small a cross-section as possible. Their maximum dimensions will be defined hereafter.

According to an embodiment, at the stage of the manufacturing process, solid substrate 20 is free from any other element. Especially, the definition of active areas separated by field insulation areas has not been performed yet.

Figure 2B:
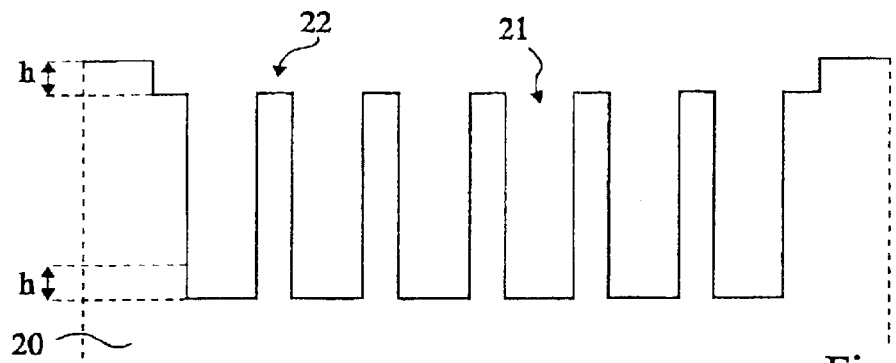

As illustrated in FIG. 2B, after the removal of a mask of definition of trenches 21, an anisotropic etching of the silicon of substrate 20 is performed, which also etches the periphery of the region where trenches 21 have been formed. Pillars 22 separating two trenches 21 lower by a height h with respect to the upper surface of peripheral substrate 20. Trenches 21 are also deepened by height h.

At least after this removal step, or even before, trenches 21 preferably have a depth greater than that which would be exhibited by a trench intended for the forming of a field insulation area delimiting an active area.

Figure 2C:
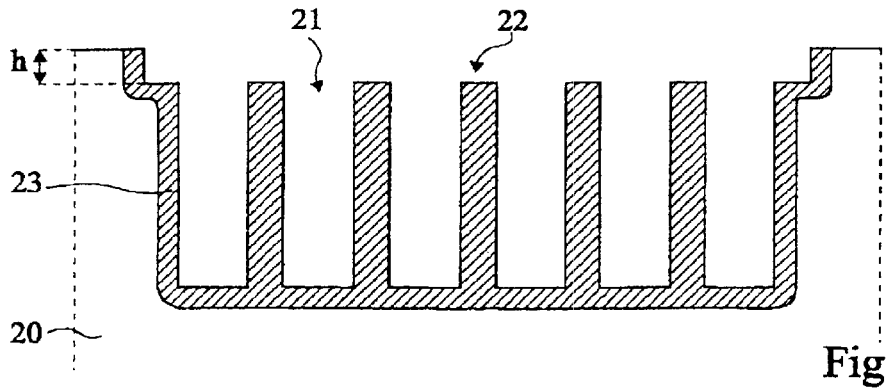

Then, as illustrated in FIG. 2C, an anneal adapted to completely oxidizing pillars 22 is performed. During this anneal, the bottoms of the trenches and portions 23 of substrate 20 peripheral to the trenches are also oxidized.

The dimensions of pillars 22 formed in the step described in relation with FIG. 2A, as well as the oxidation conditions, are optimized according to one another to enable full oxidation of pillars 22 in a relatively short time.

Figure 2D:
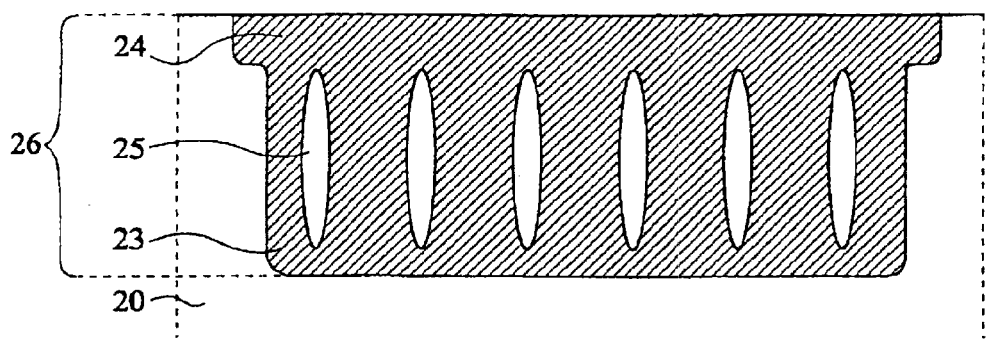

At the next steps, illustrated in FIG. 2D, trenches 21, as well as the empty upper part recessed by h with respect to the upper surface of peripheral solid substrate 20, are closed by means of an insulating material 24. More specifically, the deposition of material 24 is a specific deposition adapted to leaving in trenches 21, that is, between two previously oxidized pillars 22, an air gap 25. A thick insulating layer 26, which can be distinguished from a conventional field insulation area, has thus been formed in substrate 20 at least in that it has a lower electric permittivity, that is, a higher characteristic of insulation from the underlying substrate.

This reduced permittivity results from the formation of air gaps 25. This reduction may also be linked to an increased depth with respect to a conventional field insulation area. Another difference between an area 26 according to the present invention and a field insulation area is their object. A field insulation area is intended to ensure a horizontal insulation, of very small dimension, between the active components formed at the surface of a substrate. Conversely, insulating area 26 is intended, as will better appear from the following description, to ensure a vertical insulation in the substrate thickness on a given surface, corresponding to the dimensions of a line.

The method then carries on with usual steps. For example, active areas in which are formed various active and/or passive components are defined by insulating regions (field insulation areas) in substrate 20.

Figure 2E:
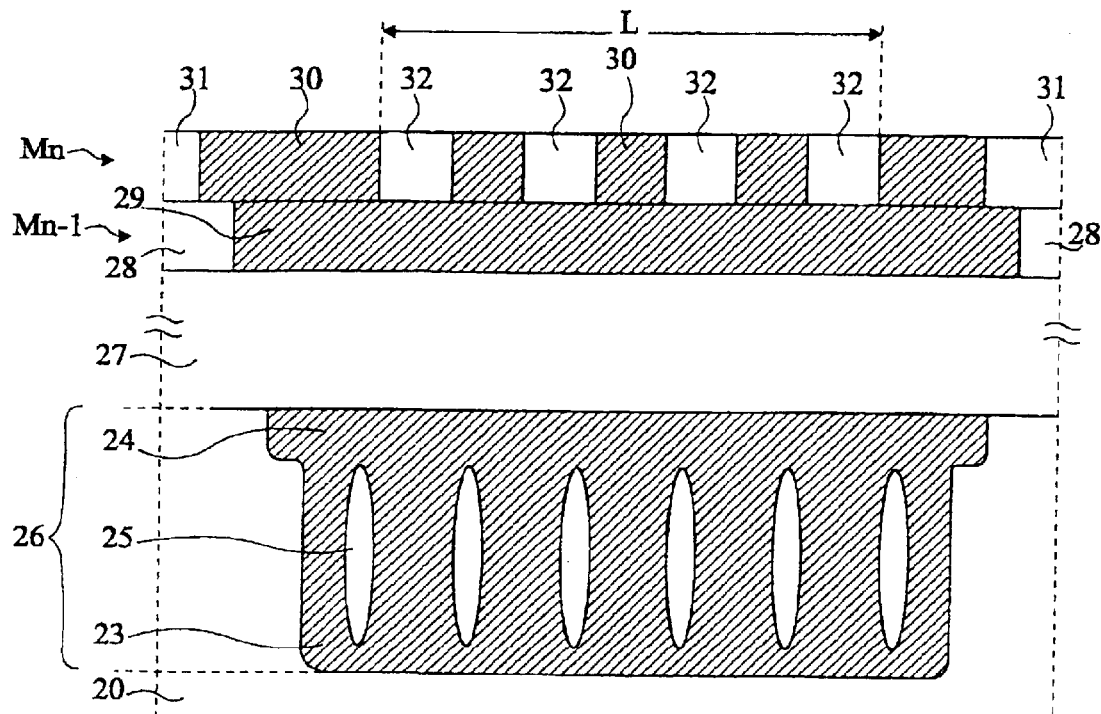

Then, as illustrated in FIG. 2E, the integrated circuit forming method carries on with the forming above substrate 20 of several conductive layers. It is ascertained not to form any element, that is, no component and no interconnection (routing) line above area 26.

Various layers, generally designated in FIG. 2E with reference 27, are thus formed. Finally, a given layer Mn−1 in which metal interconnects (lines or vias) 28 separated by insulating portions 29 are formed is reached. The portion of layer Mn−1 above area 26 is formed by an insulating portion only.

According to an embodiment, the next layer, Mn, includes interconnects 31 and spirals 32 of inductance L inside of an insulator 30. Interconnects 31 and spirals 32 are simultaneously formed in a same lightly-resistive conductive material, preferably, a metal, for example, copper. Interconnects 31 correspond to interconnects which would normally have been formed in the last metallization layer of a given integrated circuit.

According to an alternative, not shown, the next layer Mn is dedicated to the forming of the sole spirals 32 in a lightly resistive conductive material, preferably a metal, for example, copper.

As a non-limiting example, substrate 20 is single-crystal silicon. Trenches 21 have a depth ranging between 1 and 50 μm, for example, 10 μm. Pillars 22 have a width ranging between 0.1 and 1 μm, for example, 0.2 μm. Recess h is included between 0.3 and 1 μm, for example, 0.5 μm. The oxidation anneal is performed at a relatively high temperature, on the order of 1,000° C., for a relatively long time from 10 to 30 mn.

Figure 3:
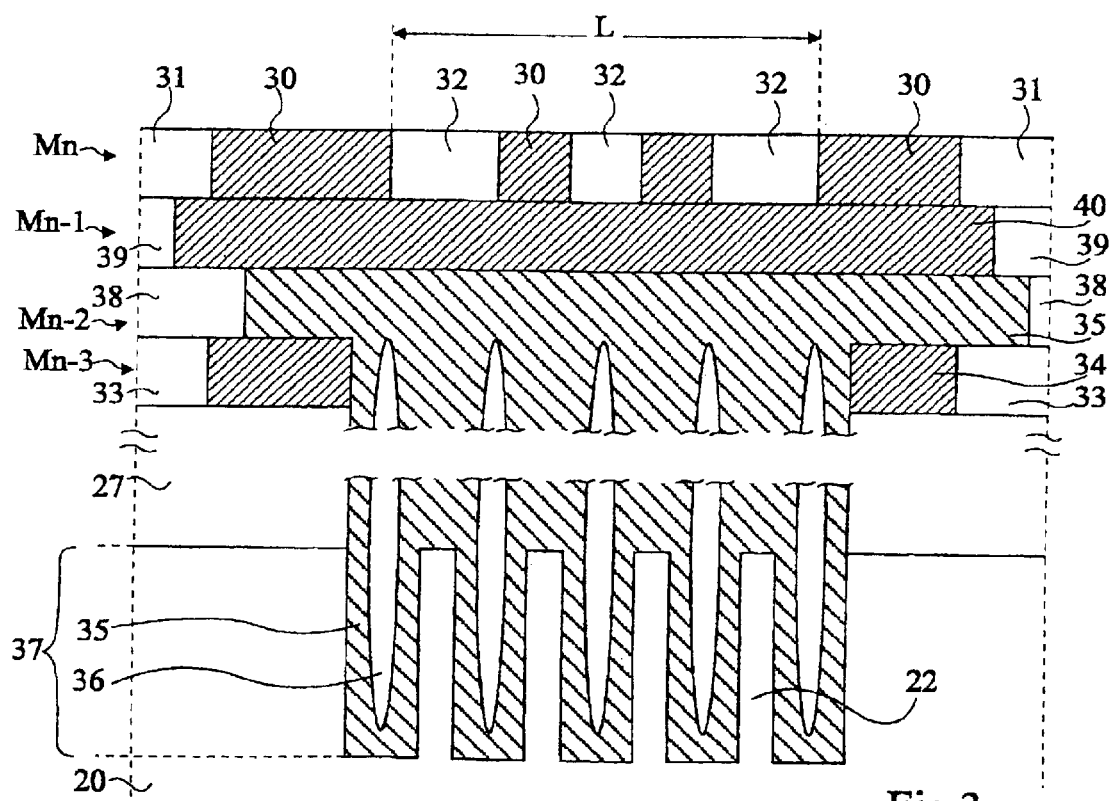
FIG. 3 illustrates, in a partial simplified cross-section view, another embodiment of the present invention.

FIG. 3 illustrates the result of another embodiment of an insulating area according to the present invention. This embodiment differs from that previously described in relation with FIG. 2 essentially in that silicon pillars 22 separating two trenches dug into a solid substrate 20 are not oxidized. Suppressing the previously-described oxidation (FIG. 2C) enables forming insulating area 26 at any stage of the general integrated circuit forming process before forming of inductance L.

For example, as illustrated in FIG. 3, various successive conductive layers are formed on a massive substrate 20. Reference 27 designates any number of layers in which are formed various elements such as passive and/or active components and interconnection lines. Such a layer Mn−3 includes metal portions 33 separated by insulating portions 34. An insulating portion 34 is provided above the area of inductance L. Upon forming of a layer Mn−2, lower layers 27, Mn−3, and solid substrate 20 are altogether opened according to a trench pattern such as described previously in relation with FIG. 2A. The trenches, separated in substrate 20 by silicon pillars 22, are then closed by an insulating material 35, preferably, to maintain gaps 36 in the trenches. It should be noted that the trenches have in solid substrate 20 a depth greater than that of trenches intended for the forming of field insulation areas delimiting active areas. An insulating area 37 is thus formed in solid substrate 20. Then, the planar upper part of material 35 (layer Mn−2) is selectively opened, after which a conductive material, preferably a metal, for example, copper, is deposited and etched to form conductive portions 38 except above area 37. The process then carries on with the forming of various other metallization layers. A layer Mn−1 in which insulating portions 39 separate metal portions 40 has been shown in FIG. 3. It is ascertained that only an insulating portion 39 is above insulating area 37.

Finally, in the next layer Mn, spirals 32 of an inductance L are formed in an insulating layer 30, for example, simultaneously, as previously described in relation with FIG. 2E, with interconnection lines 31.

Of course, this embodiment may be modified. Thus, the number of layers formed on solid substrate 20 before opening of the trenches may be modified in any appropriate manner. Especially, the trenches may be dug directly into solid substrate 20, before forming of conductive layers thereon. Similarly, the forming of area 37 may be performed only immediately before forming of inductance L, from layer Mn.

FIGS. 4A to 4D illustrate, in a partial simplified cross-section view, another embodiment of the present invention.

Figure 4A:
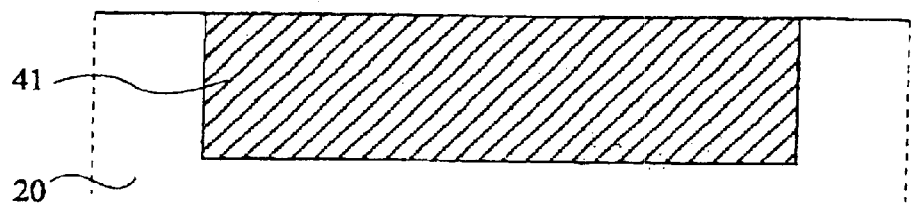
FIGS. 4A to 4D illustrate, in partial simplified cross-section views, another mode of forming an insulating area according to the present invention.

As illustrated in FIG. 4A, this embodiment starts by forming in a solid substrate 20 an area filled with a material 41. For example, a trench is dug into substrate 20 and filled with material 41, the nature of which will be specified in relation with FIG. 4C. The upper surface of material 41 is coplanar with the upper surface of peripheral solid substrate 20.

At this stage of the process, substrate 20 may already have undergone other processings. For example, active areas may have been defined by field insulation areas and regions of the active areas may have been selectively doped.

Figure 4B:
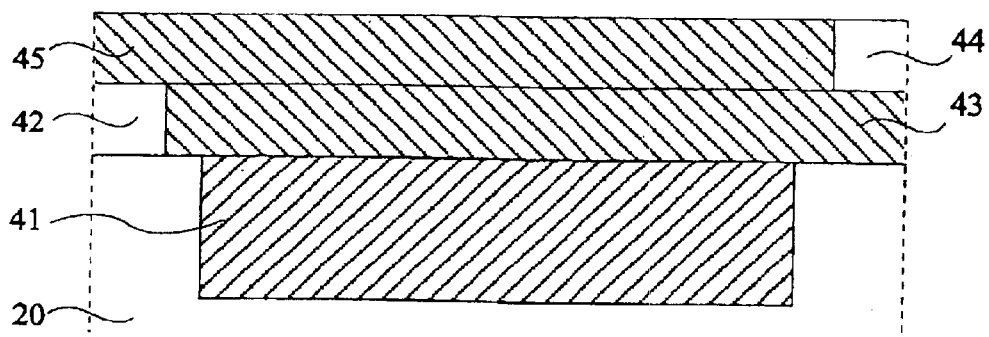

At the next steps, illustrated in FIG. 4B, the process carries on with usual steps. For example, the forming of active and/or passive components in solid substrate 20 is continued or completed. Then, various conductive layers are formed on solid substrate 20. As a non-limiting example, the forming of two layers above substrate 20 has been shown in FIG. 4B. A first layer, directly formed on substrate 20, includes at least one conductive portion 42 formed in an insulating layer 43. Similarly, the second layer, formed above the first one, includes at least one conductive element 44 embedded in an insulator 45.

Figure 4C:
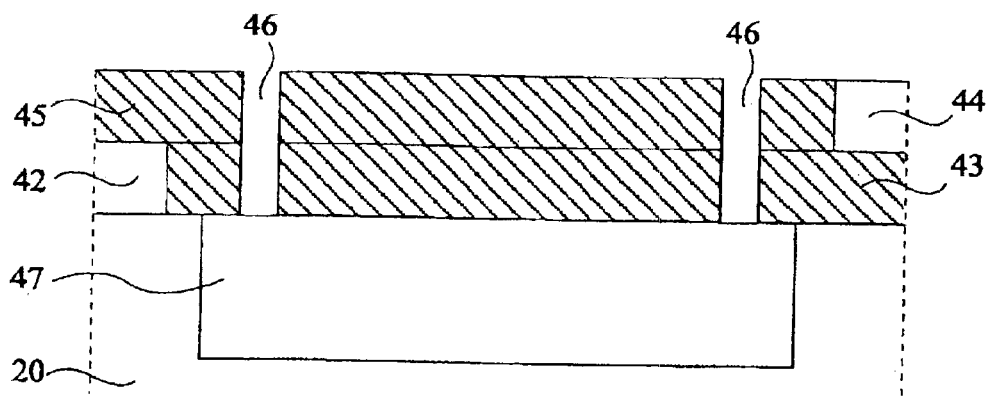

At the next steps, illustrated in FIG. 4C, chimneys 46 are opened in the piling of the various layers formed on solid substrate 20 to partially expose the upper surface of material 41. Such chimneys 46 are in practice formed in a piling of insulating materials, preferably the same material, such as silicon oxide ($SiO_2$). Indeed, similarly to what has been previously described in relation with FIGS. 2 and 3, it will be ascertained to form no element above material 41. Once chimneys 46 have been opened, a processing adapted to eliminating material 41 only is carried out. A cavity 47 is thus formed in substrate 20. Material 41 is a porous insulator or a polymer chosen to fulfil the two following constraints:

to be sufficiently resistant to stand the mechanical constraints imposed by the level piling formed thereabove; and to be likely to be easily selectively removed.

Figure 4D:
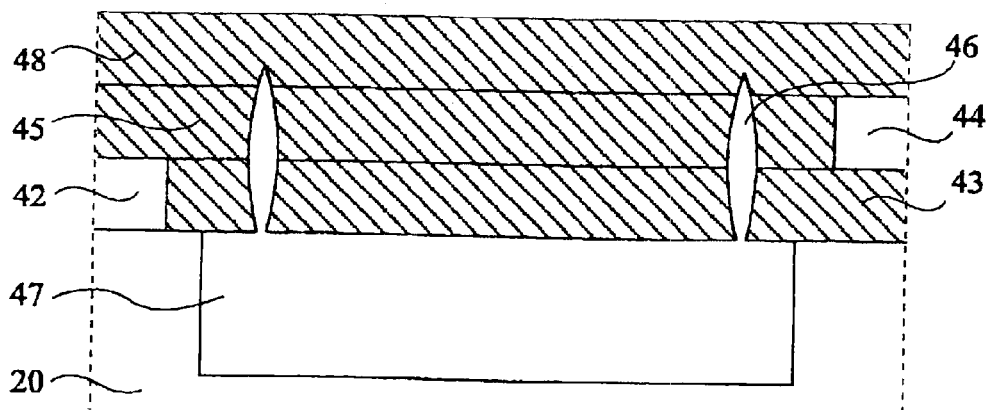

It will be noted that the steps illustrated in FIGS. 4C and 4D are not necessarily implemented immediately after the steps of FIGS. 4A and 4B. Intermediate steps can be provided. For example, the steps of FIGS. 4C and 4D can be implemented after the formation of an inductance over or in layer 48.

According to an embodiment, material 41 is a polymer which is easily removed by an etch solution having a high selectivity with respect to insulators 43, 45 that it must cross to reach material 41. For example, material 41 will be a resist, for example, from the polyhydrixystyrene family, usually used to form masks. This material has the advantage of already being used in current integrated circuit forming processes, and of being easily removed by etch solutions selective with respect to currently-used insulating materials. Such resists are, for example, JSR resists, novolaks, acrylates.

According to another embodiment material 41 will be a polymer which will evaporate at a relatively low temperature on the order of a few degrees Celsius, for example, 300° C., that is, sufficiently low to avoid damaging the elements (doped regions in the substrate, components, lines, vias . . . ) formed in other parts of the integrated circuit. Such polymers will for example be selected from the polycaprolactone or the polyimide family.

It will be ascertained, upon forming of chimneys 46, to form as may as necessary to evacuate material 41 without affecting the subsequent circuit stability.

At the next steps, illustrated in FIG. 4D, an insulating layer 48 is deposited so that its upper surface is substantially planar. The deposition of layer 48 is performed so that cavity 47 remains. Layer 48 closes the upper opening of chimneys 46, preferably without filling them.

Then, the method carries on with steps similar to those previously described and not shown in FIG. 4 of forming in insulating layer 48 of conductive portions, of possible forming of intermediary layers and of the upper layer in which the conductive lines intended to receive high-frequency and/or high currents and, possibly, simultaneously the interconnection lines are formed. This upper layer may be layer 48 itself.

An advantage of this embodiment with respect to the preceding embodiments is to ensure a maximum protection between the line and solid substrate 20. Indeed, the absence of any material in cavity 47 limits parasitic coupling risks to a minimum.

Of course, the present invention is likely to have various alterations, modifications, and improvements which will readily occur to those skilled in the art. In particular, each time one or several layers have been shown in the different drawings, they are described as non-limiting examples only. A great number of layers, as well as none, may be formed. Further, when the deposition of an insulating layer 24, 35 to close trenches 21 while maintaining gaps 25, 36 therein has been described in the first two embodiments of an insulating area 26, 37 in a solid substrate 20, in relation with FIGS. 2D or 3, the involved insulating layer 24, 35 could be deposited to completely fill the trenches.

In the foregoing description, it has been indicated that the various conductive layers deposited above the substrate would form interconnection layers or lines. Portions of these layers may define pads. An interconnection line may extend over several thicknesses of conductive layers. Further, those skilled in the art should note that the nature and/or the arrangement of these conductive layers may be used to form elementary components, generally passive (such as capacitors and resistors) and possibly active (such as diodes). Those skilled in the art will also known how to adapt the components and dimensions of the different materials used to a given technology.

Further, in the foregoing description, the present invention has been applied to the forming of an inductance. However, the present invention applies to the forming of any conductive line run through by a high-frequency and/or high current to avoid inductive and/or capacitive couplings between this conductive line and lower conductive levels. For example, such an area may be used under lines of propagation of a high-frequency synchronization or clock signal or else under a MIM-type capacitance.

Similarly, the forming of an inductance in a single conductive layer (Mn) has been shown and described as a non-limiting example. However, the line formed above an insulating area according to the present invention may extend in more than one layer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming at least one conductive line above a given portion of a substrate outside of which are formed other components, including the steps of:
    a) digging a plurality of trenches into the substrate, so that pillars remain between the plurality of trenches;
    b) etching said pillars so that an upper surface level of each of said pillars is under an upper surface level of the substrate;
    c) performing an anneal adapted to cause full oxidation of said pillars without filling said plurality of trenches;
    d) depositing an insulating material in the plurality of trenches such that an air gap defined by the insulating material is formed in each of the plurality of trenches; and
    e) forming said at least one conductive line.

2. The method of claim 1, wherein said at least one conductive line is formed simultaneously with metal interconnects of some of the other components.

3. The method of claim 1, wherein said at least one conductive line is formed above the insulating material.

4. The method according to claim 3, wherein said at least one conductive line is formed simultaneously with metal interconnects of some of the other components.

5. The method according to claim 1, wherein said at least one conductive line is formed prior to depositing the insulating material.

6. The method according to claim 5, wherein said at least one conductive line is formed simultaneously with metal interconnects of some of the other components.

7. A method for forming at least one conductive line above a given portion of a substrate outside of which are formed other components, including the steps of:
    a) digging a trench in the substrate;
    b) depositing a first insulating material in said trench, so that an upper surface of the first insulating material is substantially coplanar with an upper surface of the substrate;
    c) forming in and on the substrate at least one of at least one insulating and at least one conducting layer;
    d) digging chimneys to partially expose the upper surface of the first insulating material;
    e) removing some of the first insulating material through said chimneys such that a cavity is formed in the substrate; and
    f) depositing a second insulating material within said chimneys such that an air gap defined by said second insulating material is formed in said chimneys.

8. The method of claim 7, wherein the first insulating material is a polymer of the polycaprolactone family or of the polyimide family.

9. The method of claim 7, wherein step c) includes forming said at least one conductive line simultaneously with metal interconnects of some of the other components on the substrate.

10. The method according to claim 7, wherein the second insulating material is deposited within said chimneys such that an air gap defined by the second insulating material is formed in said chimneys and such that said cavity is not filled by the second insulating material.

* * * * *

UNITED STATES PATENT AND TRADEMARK OFFICE
CERTIFICATE OF CORRECTION

PATENT NO. : 6,949,444 B2
DATED : September 27, 2005
INVENTOR(S) : Joaquim Torres, Vincent Arnal and Alexis Farcy It is certified that error appears in the above-identified patent and that said Letters Patent is hereby corrected as shown below:

<u>Title page,</u>
Item [75], should read:
-- [75] Inventors: Joaquim Torres, Saint Martin le Vinoux (FR); Vincent Arnal, Grenoble (FR); Alexis Farcy, La Ravoire (FR) --.

<u>Column 8,</u>
Line 1, should read:
-- 3. The method according to claim 1, wherein said at least one --.

Signed and Sealed this

Twenty-ninth Day of November, 2005

JON W. DUDAS
*Director of the United States Patent and Trademark Office*